US012770045B2

(12) United States Patent
Lähteenmäki

(10) Patent No.: US 12,770,045 B2
(45) Date of Patent: Oct. 20, 2026

(54) METHODS AND ARRANGEMENTS FOR DRIVING A QUANTUM MECHANICAL SYSTEM WITH CUMULATIVE INPUTS

(71) Applicant: IQM FINLAND OY, Espoo (FI)

(72) Inventor: Pasi Lähteenmäki, Espoo (FI)

(73) Assignee: IQM FINLAND OY, Espoo (FI)

( * ) Notice: Subject to any disclaimer, the term of this patent is extended or adjusted under 35 U.S.C. 154(b) by 0 days.

(21) Appl. No.: 19/136,740

(22) PCT Filed: Dec. 8, 2022

(86) PCT No.: PCT/FI2022/050820
§ 371 (c)(1),
(2) Date: Jun. 6, 2025

(87) PCT Pub. No.: WO2024/121452
PCT Pub. Date: Jun. 13, 2024

(65) Prior Publication Data
US 2026/0203629 A1 Jul. 16, 2026

(51) Int. Cl.
*H03K 17/92* (2006.01)
*G06N 10/40* (2022.01)

(52) U.S. Cl.
CPC ............. *G06N 10/40* (2022.01); *H03K 17/92* (2013.01)

(58) Field of Classification Search
CPC ......... H03K 17/92; G06N 10/20; G06N 10/40
USPC ................................. 327/527, 528, 108–112
See application file for complete search history.

(56) References Cited

PUBLICATIONS

Ayala, C., et al., "MANA: A Monolithic Adiabatic iNtegration Architecture Microprocessor Using 1.4-zJ/op Unshunted Superconductor Josephson Junction Devices", IEEE Journal of Solid-State Circuits, vol. 56, No. 4, Apr. 2021. (Year: 2021).*
Ayala et al, "MANA: A Monolithic Adiabatic iNtegration Architecture Microprocessor Using 1.4-zJ/op Unshunted Superconductor Josephson Junction Devices", IEEE Journal of Solid-State Circuits, IEEE, USA, vol. 56, No. 4, Dec. 15, 2020, pp. 1152-1165.
Takashi et al., "Operation of an Adiabatic Quantum-Flux-Parametron Gate Using an On-Chip AC Power Source", IEEE Transactions on Applied Superconductivity, IEEE, USA, vol. 23, No. 4, Aug. 1, 2013, p. 1301605.
(Continued)

*Primary Examiner* — Tomi Skibinski
(74) *Attorney, Agent, or Firm* — Meunier Carlin & Curfman LLC

(57) ABSTRACT

A driver circuit for a qubit comprises a first Josephson junction or first array of Josephson junctions, having a first critical current, and a second Josephson junction or second array of Josephson junctions, having a second critical current. An inductive path connects a first side of the first junction to a first side of the second junction, and ground connections connect respective second sides of the first junction and the second junction to a fixed reference potential. The data input and pulse output are at an intermediate point of said inductive path. The driver circuit comprises a differential clock input comprising two connections through respective inductors, one to said first half of said first junction and the other to said first half of said second junction. Said first and second critical currents differ from each other by a predefined offset.

18 Claims, 5 Drawing Sheets

(56) References Cited

PUBLICATIONS

Naoki et al., "Directly coupled adiabatic superconductor logic", Superconductor Science and Technology, IOP Publishing, Techno House, Bristol, GB, vol. 33, No. 6, May 1, 2020, p. 65002.
Yamazaki et al., "A Compact Interface Between Adiabatic Quantum-Flux-Parametron and Rapid Single-Flux-Quantum Circuits", IEEE Transactions on Applied Superconductivity, IEEE, USA, vol. 31, No. 5, Apr. 8, 2021, pp. 1-5.
International Search Report and Written Opinion issued in PCT/FI2022/050820, mailed Sep. 11, 2023.

* cited by examiner

METHODS AND ARRANGEMENTS FOR DRIVING A QUANTUM MECHANICAL SYSTEM WITH CUMULATIVE INPUTS

CROSS REFERENCE TO RELATED APPLICATIONS

This application is a U.S. National Stage application filed under 35 U.S.C. § 371 of PCT/FI2022/050820, filed on Dec. 8, 2022.

FIELD OF THE INVENTION

The invention is generally related to quantum information processing. In particular, the invention is related to hardware and methods that can be used to drive desired qubit(s) of a large quantum information processing system with only a modest number of driving signal lines.

BACKGROUND OF THE INVENTION

Quantum information processing systems perform calculations using qubits, which are quantum mechanical systems with discrete energy spectra, used as effective two-level systems capable of exhibiting transitions between their states. A qubit can be driven by injecting a driving (or excitation) signal through a driving port 102.

FIG. 1 illustrates schematically a quantum information processing system that comprises N qubits, where N is a positive integer. Of said N qubits, three qubits 101, 102, and 103 are shown in FIG. 1. The outer perimeter 104 represents a cryogenically cooled environment for maintaining the qubits at the required very low temperature. In the embodiment shown in FIG. 1, the gigahertz-range frequencies needed to make the qubits perform quantum computing operations are brought in from control electronics located in the surrounding room temperature environment. It is also possible to controllably generate gigahertz-range frequencies within the cryogenically cooled environment, using for example the technology explained in a co-pending European patent application EP20712003.1, published as EP3939160.

Data that conveys the input information to be used in the quantum computing operations is brought in from the room temperature environment. Similarly, data that conveys the output results of the quantum computing operations are brought out to the room temperature environment. Both data streams are shown schematically in FIG. 1.

In addition to the qubits, the system comprises superconducting electronics in the cryogenically cooled environment. A bulk of such superconducting electronics is shown as block 105 in FIG. 1. Input couplings from said block to the qubits 101, 102, and 103 are shown as going through a qubit interface demultiplexing block 106 in FIG. 1. On the output side of the qubits, there are a qubit interface detecting block 107 for detecting the quantum states acquired by the qubits, as well as a qubit interface multiplexing block 108 for conveying the detection data further to the main superconducting electronics block 105. Additionally, FIG. 1 shows schematically some bias circuits 109, 110, and 111 for calibrating the qubits 101, 102, and 103 respectively.

In a large quantum information processing system, the number of control signal lines needed to control all qubits may become prohibitively large. The sophisticated electronics and cables needed to handle and convey the control signals are expensive, and every connection between the room temperature environment and the cryogenically cooled environment represents an additional source of both conducted and dissipated heat, making it increasingly difficult to maintain the required millikelvin-range temperatures.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an objective to provide a method and an arrangement for driving desired qubits of a large quantum information processing system with a reasonable cost in the amount and complicatedness of hardware. Another objective is to achieve very low levels of dissipation in a qubit driving system of said kind.

These and further advantageous objectives are achieved by using specially designed AQFP-like driver circuits responsive to two or more simultaneous driving signals. A combination of such driving signals produces a cumulative effect that makes a desired driver circuit generate a desired sequence of control pulses to a qubit, while simultaneously ensuring that other similar driver circuits in the system only generate idle pulse sequences that do not cause unwanted driving.

According to a first aspect, there is provided a driver circuit for a qubit. The driver circuit comprises a first Josephson junction or first array of Josephson junctions, having a first critical current, and a second Josephson junction or second array of Josephson junctions, having a second critical current. An inductive path connects a first side of the first junction to a first side of the second junction, and ground connections connect respective second sides of the first junction and the second junction to a fixed reference potential. The data input and pulse output are at an intermediate point of said inductive path. The driver circuit comprises a differential clock input comprising two connections through respective inductors, one to said first half of said first junction and the other to said first half of said second junction. Said first and second critical currents differ from each other by a predefined offset.

According to an embodiment, said selected off-set is between 50 nA and 1000 nA. This involves at least the advantage that the effect of the offset on the operation of the circuit becomes clearly visible and available for utilization, without necessitating very difficult modifications to the design or to the manufacturing process.

According to an embodiment, said first critical current and said second critical current both are larger than 1 μA and smaller than 20 μA. This involves at least the advantage that the junctions can be made in a reasonable size with known and robust technologies.

According to an embodiment, the driver circuit comprises a coupling transformer with a primary inductance inductively coupled to a secondary inductance. Said primary inductance may then be coupled to said pulse output and said secondary inductance may be coupled to an output node of the coupling transformer. This involves at least the advantage of providing better isolation at the output of the driver circuit.

According to an embodiment, the driver circuit comprises a further stage that comprises a third Josephson junction or third array of Josephson junctions and a fourth Josephson junction or fourth array of Josephson junctions. Said further stage of the driver circuit comprises a second inductive path connecting a first side of the third junction to a first side of the fourth junction. Said further stage of the driver circuit may then comprise ground connections connecting respective second sides of the third junction and the fourth junction to said fixed reference potential, and a further data input and a further pulse output at an intermediate point of said second inductive path. Said further data input of said further stage of the driver circuit may be coupled to said output node of the coupling transformer. This involves at least the advantage of enabling further, more advanced control of the amplitude and shape of the driving signal pulses to the qubit.

According to an embodiment, the further stage of the driver circuit comprises a differential clock input of its own. The differential clock inputs of said driver circuit and said further stage of the driver circuit may then be coupled to clock signal sources of different frequencies. This involves at least the advantage of facilitating further, more advanced control of the amplitude and shape of the driving signal pulses to the qubit.

According to an embodiment, the differential clock input of the driver circuit is coupled to a clock signal source of a clock signal frequency two times that of a clock signal source to which the clock input of the further stage of the driver circuit is coupled. This involves at least the advantage of only requiring a relatively low clock frequency for the final stage of the driver circuit.

According to a second aspect, there is provided a quantum information processing system that comprises a first plurality of qubits to be driven. The quantum information processing system comprises a second plurality of driver circuits of the kind described above, as well as couplings between the pulse outputs of at least some of said driver circuits and at least some of said qubits. The quantum information processing system is configured to feed one or more oscillating clock signals to the differential clock inputs of said driver circuits, and to selectively feed data signals to the data inputs of said driver circuits.

According to an embodiment, said second plurality of driver circuits form a matrix of driver circuits arranged in at least first and second dimensions of said matrix. For said selective feeding of data signals, the quantum information processing system may then comprise an array of control signal lines, said array comprising at least a first subset and a second subset of control signal lines. The control signal lines of said first and second subsets may cross said matrix in said first and second dimensions, respectively, with each driver circuit of said second plurality of driver circuits being the unique driver circuit coupled to a respective unique pair of a control signal line of the first subset and a control signal line of the second subset. The quantum information processing system may then be configured to selectively feed synchronized control signals through unique pairs of a control signal line of the first subset and a control signal line of the second subset for making the unique driver circuit coupled to these drive a corresponding qubit. This involves at least the advantage that a relatively small number of control signal lines are needed even if there are a relatively large number of qubits and driver circuits.

According to an embodiment, said array of control signal lines comprises, in addition to said first and second subsets, a third subset of control signal lines crossing said matrix in a third dimension. Each driver circuit of said second plurality of driver circuits may then be the unique driver circuit coupled to a respective unique triplet of a control signal line of the first subset, a control signal line of the second subset, and a control signal line of the third subset. The quantum information processing system may be configured to selectively feed synchronized control signals through unique triplets of a control signal line of the first subset, a control signal line of the second sub-set, and a control signal line of the third subset, for making the unique driver circuit coupled to these drive a corresponding qubit. This involves at least the advantage that a relatively small number of control signal lines are needed even if there are a relatively large number of qubits and driver circuits.

According to an embodiment, the quantum information processing system is configured to use sinusoidal signals as said control signals. This involves at least the advantage that the control signals can be generated with relatively simple circuitry.

According to an embodiment, the quantum information processing system is configured to use square pulses as said control signals. This involves at least the advantage that the possibility of unintendedly generating random output signals decreases significantly.

According to an embodiment, the quantum information processing system comprises as many output driver circuits as there are said qubits, with each of said output driver circuits configured to drive a respective one of said qubits. Additionally, the quantum information processing system may comprise a set of drive logic circuits, fewer in number than said output driver circuits, and a set of output selection logic circuits, fewer in number than said output driver circuits, coupled between said drive logic circuits and said output driver circuits and configured to selectively couple outputs of said drive logic circuits to selected ones of said output driver circuits. This involves at least the advantage that the amount of circuitry needed to drive the qubits remains relatively small, enabling building quantum information processing systems with larger numbers of qubits.

According to a third aspect, there is provided a quantum computer comprising a quantum information system of the kind described above.

According to a fourth aspect, there is provided a method for producing driving signals for a qubit using a driver circuit. Here the driver circuit means one that comprises a first Josephson junction or first array of Josephson junctions, having a first critical current; a second Josephson junction or second array of Josephson junctions, having a second critical current; an inductive path connecting a first side of the first junction to a first side of the second junction; and ground connections connecting respective second sides of the first junction and the second junction to a fixed reference potential. Said first and second critical currents differ from each other by a predefined offset. The method comprises providing the two components of a first differential clock signal to the driver circuit simultaneously through respective two inductors, one coupled to said first half of said first junction and the other coupled to said first half of said second junction. The method comprises also providing pulsating data signals to a data input at an intermediate point of said inductive path, and conducting pulsating output signals towards said qubit through a pulse output at said intermediate point.

According to an embodiment, the method comprises conducting said pulsating output signals into a primary inductance of a coupling transformer and conducting respective pulsating further output signals from a secondary inductance of said coupling transformer, inductively coupled to said primary inductance, towards said qubit. This involves at least the advantage of providing better isolation at the output of the driver circuit.

According to an embodiment, the method comprises conducting said pulsating further output signal into a data input of a further stage of the driver circuit. The further stage may comprise a third Josephson junction or third array of Josephson junctions; a fourth Josephson junction or fourth array of Josephson junctions; a second inductive path connecting a first side of the third junction to a first side of the fourth junction; and ground connections connecting respective second sides of the third junction and the fourth junction to said fixed reference potential. Said data input of said further stage of the driver circuit may be at an intermediate point of said second inductive path. The method may then comprise providing the two components of a second differential clock signal, having a different frequency than said first differential clock signal, to said further stage of the driver circuit simultaneously through respective two inductors, one coupled to said first half of said third junction and the other coupled to said first half of said fourth junction. The method may further comprise conducting pulsating output signals of said further stage of the driver circuit towards said qubit through a pulse output at said intermediate point of said second inductive path. This involves at least the advantage of enabling further, more advanced control of the amplitude and shape of the driving signal pulses to the qubit.

According to an embodiment, the clock signal frequency of said first differential clock signal is two times that of the second differential clock signal. This involves at least the advantage of only requiring a relatively low clock frequency for the final stage of the driver circuit.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

In the following description, reference is made to the accompanying drawings, which form part of the disclosure, and in which are shown, by way of illustration, specific aspects in which the present disclosure may be placed. It is understood that other aspects may be utilised, and structural or logical changes may be made without departing from the scope of the present disclosure. The following detailed description, therefore, is not to be taken in a limiting sense, as the scope of the present disclosure is defined in the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. On the other hand, for example, if a specific apparatus is described based on functional units, a corresponding method may include a step performing the described functionality, even if such step is not explicitly described or illustrated in the figures. Further, it is understood that the features of the various example aspects described herein may be combined with each other, unless specifically noted otherwise.

Figure 1:
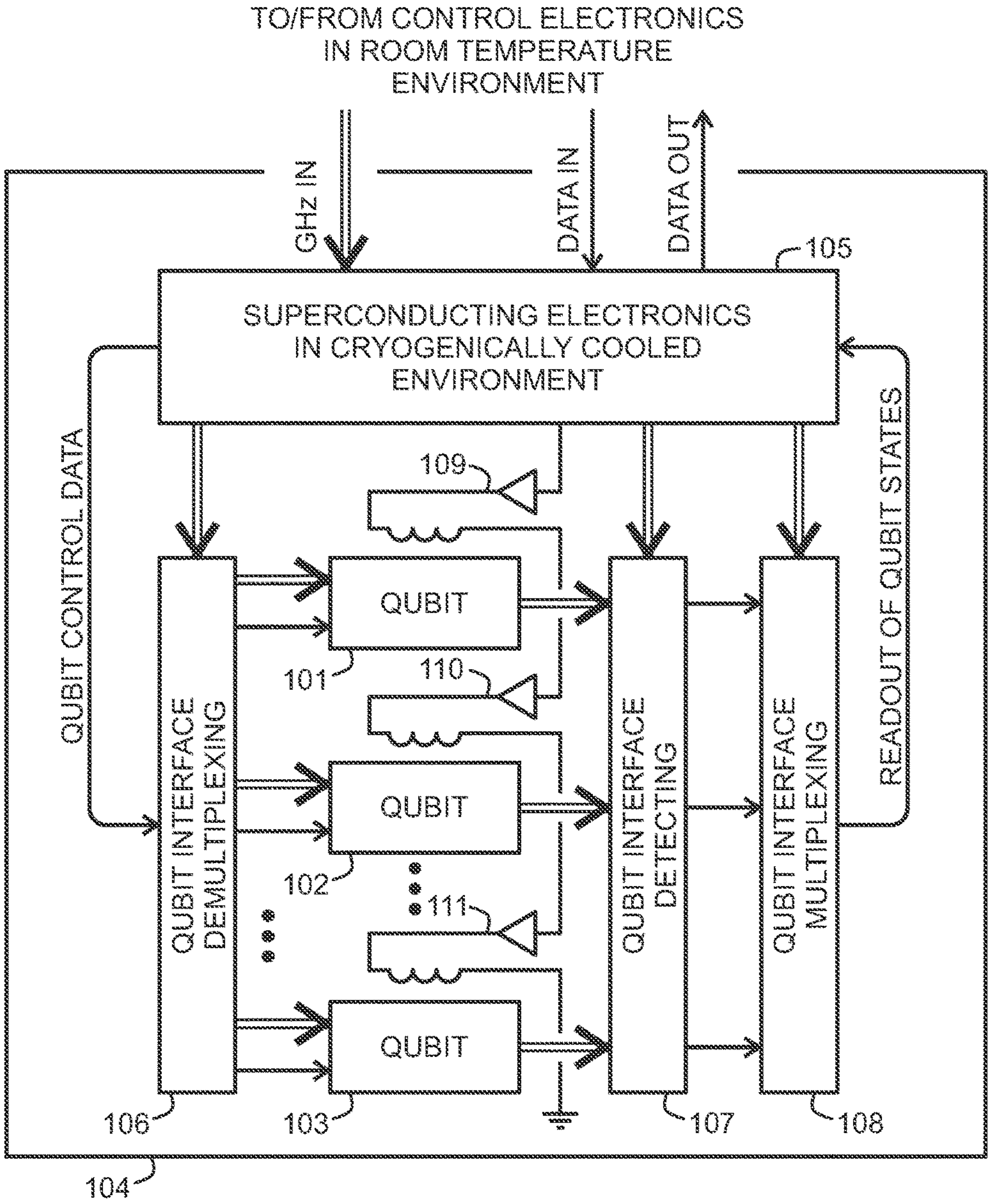
Fig. 1 PRIOR ART
FIG. 1 illustrates a quantum information processing system.
Figure 2:
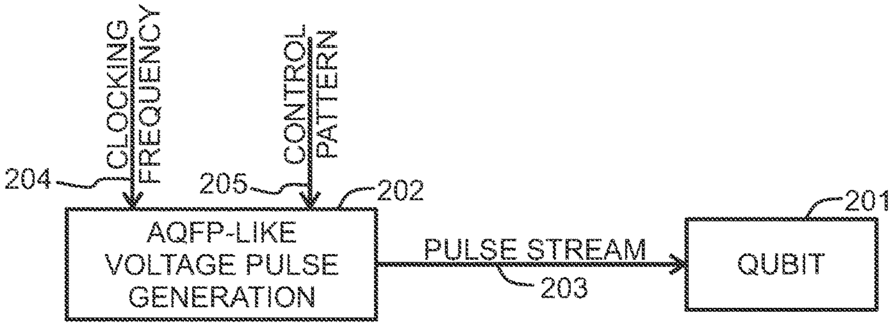
FIG. 2 illustrates a principle of using an AQFP-like driver circuit.

FIG. 2 illustrates a part of a quantum information processing system. The shown part comprises a qubit 201 and a driver circuit 202. The purpose of the driver circuit 202 is to provide a stream 203 of driving pulses to the qubit 201. In this respect, the general approach to driving the qubit 201 has some resemblance to the known SFQ (Single Flux Quantum) principle: each driving pulse in the stream 203 may subject the qubit 201 to an incremental rotation on the Bloch sphere, so that (almost) arbitrary rotations can be produced by applying a corresponding sequence of pulses. The generation of said pulses in the driver circuit utilizes two input signals, which are called the clocking frequency 204 and the control pattern 205 in FIG. 2.

Figure 3:
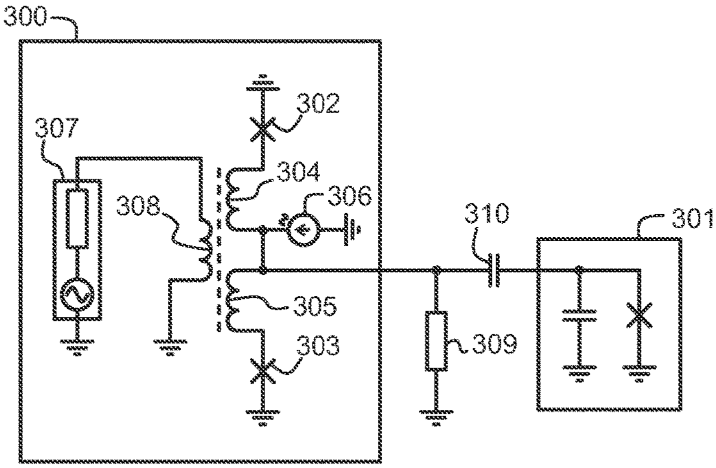
FIG. 3 illustrates an AQFP-like driver circuit configured to drive a qubit.

FIG. 3 shows one illustrative example of how the principle of FIG. 2 could be implemented in practice. This example has been explained in more detail in a co-pending patent application number PCT/FI2022/050586, which is not yet available to the public at the filing date of this text. The driver circuit 300 of the qubit 301 is configured to produce the driving pulses by repetitively causing currents through the Josephson junctions 302 and 303 and through associated additional current paths to vary in a particular way that is closely associated with the Josephson dynamics governing the behaviour of the junctions.

The driver circuit 300 of FIG. 3 comprises two Josephson junctions 302 and 303. The inherent capacitances of said Josephson junctions are not separately shown in FIG. 3 for simplicity. A control signal source 306 and a clock signal source 307 are shown as parts of the driver circuit 300. Comparing to FIG. 2, the clock signal source 307 is configured to produce the clocking frequency 204 and the control signal source 306 is configured to produce the control pattern 205.

A first inductive current path 308 couples the clock signal source 307 to a reference potential which is here shown to be the ground potential. The Josephson junctions 302 and 303 are coupled between the control signal source 306 and a reference potential through respective second inductive current paths. In the example implementation of FIG. 3, an inductance 304 exists between the control signal source 306 and the first Josephson junction 302 and another inductance 305 exists between the control signal source 306 and the second Josephson junction 303.

Together, the inductances 308, 304, and 305 constitute a kind of a clock signal transformer shown schematically as one in FIG. 3. A clock signal current that flows through the first inductive current path in-duces a corresponding current through the respective second inductive current paths. In other words, by making the clock signal source 307 generate an AC electric current of desired frequency and amplitude, one may "pump" energy across the clock signal transformer into the second inductive current paths, where the pumped energy affects the currents through the respective Josephson junctions 301 and 302.

Each Josephson junction has a critical current, i.e. a parameter value that defines the upper limit of the magnitude of electric current that can flow through the junction. If a Josephson junction is subjected to an externally applied alternating current the peak amplitude of which is larger than the critical current, and if a suitable additional current path is also available that forms a loop with the Josephson junction, during each cycle (i.e. 2*pi phase rotation) of the alternating current certain interesting variations may be observed in the currents through the various paths in synchronism with the peaks of the positive and negative half-wave of the AC current form. In short, the driver circuit 300 will generate a continuous sequence of current pulses through the terminating resistance 309 of the transmission line that links the driver circuit 300 to the qubit 301. Polarities of the pulses in the sequence can be selected by making the control signal generator 306 feed into the driver circuit 300 a desired control pattern. Corresponding voltage pulses will drive the qubit 301 through the coupling capacitance 310.

The actual current sourcing parts of the control and clock signal sources 306 and 307 are not necessarily part of the driver circuit 300 proper; the current sources can be located somewhere more distant so that only the currents they generate are brought in through suitable couplings to the driver circuit 300.

Figure 4:
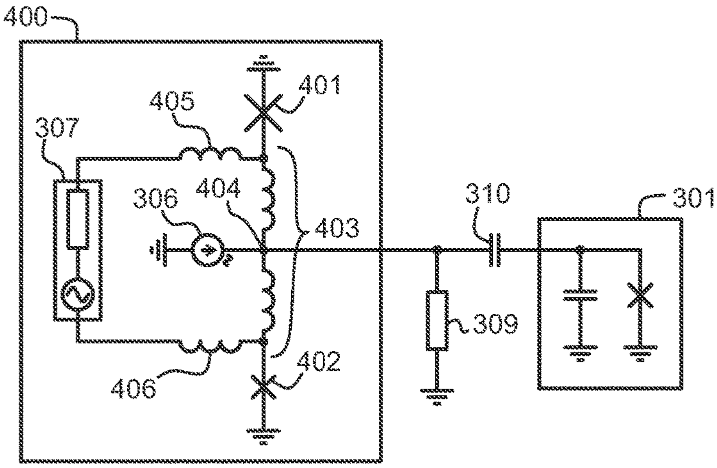
FIG. 4 illustrates an AQFP-like driver circuit configured to drive a qubit.

FIG. 4 illustrates schematically a driver circuit 400 and a qubit 301. The driver circuit 400 of FIG. 4 has both similarities with and differences to the driver circuit 300 of FIG. 3. It comprises a first Josephson junction 401 and a second Josephson junction 402. Each of these is characterised by its own critical current value, called below the first critical current and the second critical current, respectively. As a difference to the driver circuit 300 of FIG. 3, in the driver circuit 400 of FIG. 4 the first and second critical currents are not equal but differ from each other by a predefined offset. This is schematically illustrated in FIG. 4 with the differently sized graphical symbols of the two Josephson junctions. In this text, each of the first and second Josephson junctions 401 and 402 is consistently referred to in singular, although any or both of them may actually consist of an array of Josephson junctions.

The dependencies between the dimensions and materials of a Josephson junction on one hand and its critical current on the other hand are relatively well known. Consequently, the designer of a quantum information processing circuit can design a particular Josephson junction quite accurately for a certain desired critical current. Additionally, micromachining methods may be used to later tune the critical current of a manufactured Josephson junction to a desired value. In an example driver circuit like that in FIG. 4, the Josephson junctions 401 and 402 may have critical currents larger than 1 microampere and smaller than 20 microamperes, or in the order of magnitude of 5 microamperes for example. A relatively large critical current (or for example an array of two or more Josephson junctions in series) may be an advantageous choice if one wants to ultimately deliver a relatively high voltage to the qubit due to losses in the intermediate connections or if one wants to increase gate speeds. On the other hand, a relatively small critical current may be an advantageous choice if one wants to push down the overall power dissipation. The designer of the quantum information processing circuit should look for a balance between factors that may be mutually contradictory in this respect.

The offset between the individual critical current values of the Josephson junctions 401 and 402 may be between 50 and 1000 nA, like in the order of magnitude of 100 nA for example. The magnitude of the offset should in all cases be clearly larger than the noise margin in the magnitude of any control current used to control the operation of the driver circuit. Factors that may advocate going towards offsets in the higher end of said range, or even higher than 1000 nA, might include higher temperatures at which the circuit is required to operate; larger input bandwidth; or the appearance of excess noise for some reason.

As is characteristic to Josephson junctions, each of the first and second Josephson junctions 401 and 402 has a first side and a second side. The concepts of first and second sides are used here to describe the connections in the driver circuit 400 of FIG. 4. In a practical Josephson junction, each of the two sides is made of a superconductor and they are separated by a thin layer therebetween that may comprise insulator material(s) and/or non-superconducting metallic material(s).

An inductive current path 403 connects the first side of the first Josephson junction 401 to the first side of the second Josephson junction 402. There are ground connections on the other sides, so that both the second side of the first Josephson junction 401 and the second side of the second Josephson junction 402 are connected to a fixed reference potential, which here is the ground potential. The driver circuit 400 comprises a data input and a pulse output at an intermediate point 404 of the inductive path 403.

Instead of an inductively coupled clock transformer like in FIG. 3, the driver circuit 400 comprises a differential clock input. It comprises two connections through respective inductors 404 and 405, one to the first side of the first Josephson junction 401 and the other to the first side of the second Josephson junction 402. As the name indicates, the differential clock input is one that can be used to inject into the driver circuit 400 a differential clock signal, i.e. a signal in the form of an oscillating voltage and/or current difference between two nodes neither of which needs to be bound to any fixed reference potential. As an example, a differential clock signal in the form of an oscillating current difference consists of two symmetrically oscillating currents that have a phase difference of pi radians.

Similar to FIG. 3 above, the control signal source 306 and the clock signal source 307 are shown as parts of the driver circuit 400, although they could also be located somewhere more distant so that only the currents they generate would be brought in through suitable couplings to the driver circuit 400. The output node of the control signal source 306 is connected to the data input 404 at the intermediate point of the inductive path 403. The two output nodes of the clock signal source 307 are connected to the differential clock input connections at inductors 404 and 405.

The use of a differential clock input and the offset between the first and second critical currents of the first and second Josephson junctions 401 and 402 has been found to have interesting consequences. Namely, one or more thresholds can be observed in the response of the driver circuit 400 to a control current flowing between the control signal source 306 and the data input 403.

In the following, first a sinusoidally formed control current is considered, as schematically illustrated with the small sinusoid sign next to the control signal source 306 in FIG. 4. Two thresholds have been observed, called the first (lower) and second (higher) thresholds in the following:

at control current amplitudes smaller than the first (lower) threshold, the driver circuit 400 produces the idle pattern, i.e. repetitive and regular toggling between positive and negative output pulse polarities, at its pulse output 404 irrespective of the control current pattern at control current amplitudes larger than the second (higher) threshold, the polarities of the output pulses in the generated output pulse sequence can be determined by appropriately selecting the sign of the control current, much like in controlling the previously known driver circuit shown in FIG. 3.

In a simulation analysis of a driver circuit like that in FIG. 4, the first (lower) threshold was about 10 nA and the second (higher) threshold was about 30 nA. If the control current amplitude was between these two thresholds, the polarities of the output pulses changed randomly.

This finding may be utilized in a structure where the data input of a driver circuit is made to have couplings with a plurality of control signal lines. Only a combination of simultaneous control signals through said plurality of control signal lines will produce into said data input a data signal in the form of a sufficient control current, the amplitude of which exceeds the second (higher) threshold. If a control signal is passed through only one of said plurality of control signal lines, it will couple to the data input in the form of an insufficient control current, the amplitude of which remains below the first (lower) threshold. In other words, a driver circuit to which a control current comes only through the coupling with one control signal line will produce the idle pattern, while a driver circuit to which a control current comes through the couplings to the plurality of control signal lines will produce an output pulse sequence in which the polarities of the output pulses can be determined by appropriately selecting the signs of the simultaneous control signals in the plurality of control signal lines.

Figure 5:
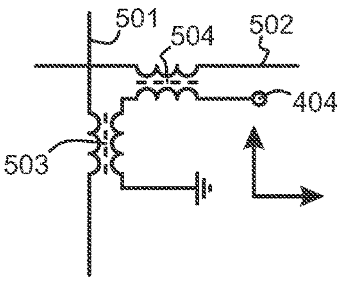
FIG. 5 illustrates using two control signal lines in a two-dimensional configuration.
Figure 6:
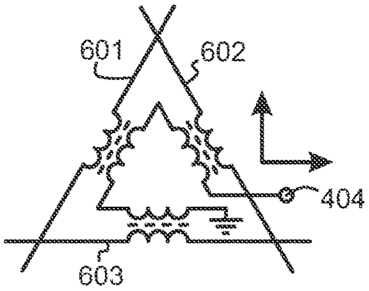
FIG. 6 illustrates using three control signal lines in a two-dimensional configuration.
Figure 7:
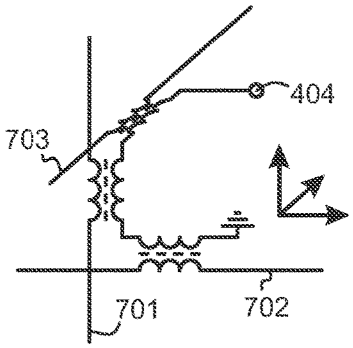
FIG. 7 illustrates using three control signal lines in a three-dimensional configuration.

FIGS. 5, 6, and 7 illustrate some examples of ways in which a plurality of control signal lines may have couplings to a data input of a driver circuit. In all three drawings, the data input of the driver circuit is assumed to be coupled to the point marked as 404. The circuit elements shown in FIGS. 5 and 6 are two-dimensional and located on a surface, while the circuit elements in FIG. 7 are located in three dimensions.

In FIG. 5 there are two intersecting control signal lines 501 and 502 that extend in perpendicular directions. Next to their intersection is a pick-up loop with inductive couplings 503 and 504 to the control signal lines 501 and 502. Simultaneous control signals in the form of appropriately directed control currents through the control signal lines 501 and 502 will induce into the pick-up loop a combination current of larger amplitude, whereas if there was a control signal through only one of the control signal lines 501 and 502 only a correspondingly smaller current would be induced into the pick-up loop.

The arrangement in FIG. 6 is otherwise similar to that of FIG. 5 but there are three intersecting control signal lines 601, 602, and 603. Again, simultaneous control signals in the form of appropriately directed control currents through the control signal lines 601, 602, and 603 will induce into the pick-up loop next to their intersection a combination current of large amplitude.

The arrangement in FIG. 6 resembles that of FIG. 6 in that also here the number of intersecting control signal lines 701, 702, and 703 is three. Instead of being two-dimensional like in FIG. 6, the structure in FIG. 7 is three-dimensional so that the three control signal lines 701, 702, and 703 extend in the three directions of a Cartesian coordinate system. Also the pick-up loop next to their intersection has a three-dimensional form in order to ensure good enough couplings with all three control signal lines.

Figure 8:
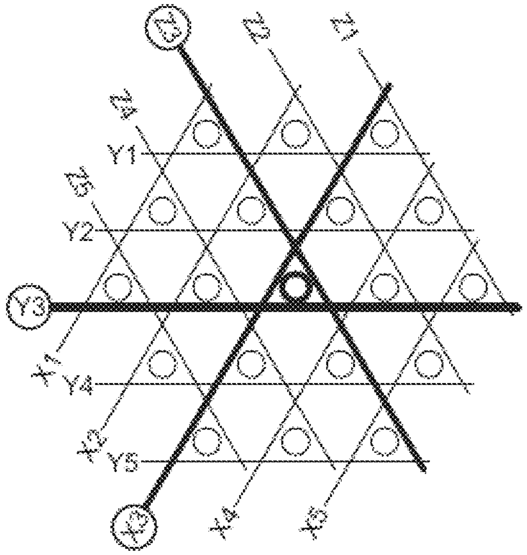
FIG. 8 illustrates addressing a desired driver circuit in a two-dimensional hexagonal matrix.
Figure 9:
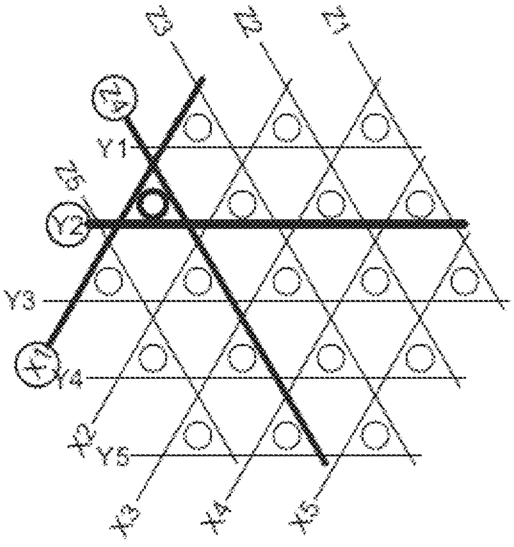
FIG. 9 illustrates addressing a desired driver circuit in a two-dimensional hexagonal matrix.

FIGS. 8 and 9 show an example of how the principle explained above may be applied for selectively driving a plurality of qubits in a quantum information processing system. As a basic assumption, the quantum information processing system comprises a first plurality of qubits to be driven and a second plurality of driver circuits of the kind described above with reference to FIG. 4. There are couplings between the pulse outputs of at least some of said driver circuits and at least some of said qubits, in order to make such driver circuits drive said qubits. Here it may be assumed that there are as many driver circuits as there are qubits, so that for each qubit there is a corresponding driver circuit in a one-to-one relationship. Each small circle in the hexagonal array of FIGS. 8 and 9 represents an individual combination of a qubit and its driver circuit.

The quantum information processing system is configured to feed one or more oscillating clock signals to the differential clock inputs of said driver circuits (not separately shown in FIGS. 8 and 9). Additionally, the quantum information processing system is configured to selectively feed data signals to the data inputs of said driver circuits by using combinations of simultaneous control signals through selected control signa lines.

As the layout is hexagonal, each of said plurality of driver circuits may be thought to be equipped with a pick-up loop like that in FIG. 6 above. In FIG. 8, the quantum information processing system feeds simultaneous control signals in the form of control currents through the control signal lines X3, Y3, and Z3. All other pick-up loops of all other driver circuits experience a maximum of one control current through an adjacent control signal line, but the pick-up loop of the driver circuit in the middle of the hexagonal array experiences simultaneous control currents through all three adjacent control signal lines. Consequently, at the data input of a corresponding driver circuit there appears a data signal that makes the driver circuit produce a non-idle pattern of control pulses to the corresponding qubit. All other driver circuits produce only idle patterns to the respective qubits they are coupled to.

In FIG. 9 the situation is otherwise the same, but the quantum information processing system feeds simultaneous control signals in the form of control currents through the control signal lines X1, Y2, and Z4. Again, the pick-up loop of only one driver circuit (that shown with a thicker line) experiences simultaneous control currents through all three adjacent control signal lines, so that at the data input of a corresponding driver circuit there appears a data signal that makes the driver circuit produce a non-idle pattern of control pulses to the corresponding qubit. The pick-up loops of all other driver circuits experience a maximum of one control current through an adjacent control signal line and thus such driver circuits produce only idle patterns to the respective qubits they are coupled to.

The examples shown in FIGS. 5 to 9 may be generalised as follows. The plurality of driver circuits forms a matrix of driver circuits arranged in at least first and second dimensions of said matrix. For selective feeding of data signals, the quantum information processing system comprises an array of control signal lines. Considering first an example like that in FIG. 5, said array comprises at least a first subset and a second subset of control signal lines. The control signal lines of said first and second subsets cross said matrix in said first and second dimensions, respectively, with each driver circuit of said second plurality of driver circuits being the unique driver circuit coupled to a respective unique pair of a control signal line of the first subset and a control signal line of the second subset. The quantum information processing system is configured to selectively feed synchronized control signals through unique pairs of a control signal line of the first subset and a control signal line of the second subset for making the unique driver circuit coupled to these drive a corresponding qubit.

In cases where the data inputs of the driver circuits are coupled to three control signal lines, said array of control signal lines comprises, in addition to said first and second subsets, a third subset of control signal lines crossing said matrix in a third dimension. Here it should be noted that said third dimension does not need to lie outside the plane defined by the first and second dimensions mentioned above; it may be simply a third distinct direction through said matrix of driver circuits. Each of said driver circuits is then the unique driver circuit coupled to a respective unique triplet of a control signal line of the first subset, a control signal line of the second subset, and a control signal line of the third subset. The quantum information processing system is configured to selectively feed synchronized control signals through unique triplets of a control signal line of the first subset, a control signal line of the second subset, and a control signal line of the third subset, for making the unique driver circuit coupled to these drive a corresponding qubit.

The array of driver circuits and corresponding qubits may as such be two-dimensional or three-dimensional. Two-dimensional arrays of driver circuits, qubits, and control signal lines are simpler to manufacture than three-dimensional, because all circuit elements of a two-dimensional structure may be manufactured on a surface of a substrate using known technologies. Three-dimensional arrays may be manufactured for example by producing several two-dimensional arrays on respective thin substrate layers, by stacking these thin substrate layers on top of each other, and by making the desired conductive interconnections between pairs of adjacent layers. A simple example of such a three-dimensional structure is a flip-chip construction, in which there are two layers stacked together.

If the driver circuits and qubits constitute a two-dimensional matrix but there are three subsets of control signal lines, with each of N driver circuits being the one coupled to a unique triplet of control signal lines (see FIGS. 6, 8, and 9), the required number of control signal lines is $3\sqrt{N}$. In a three-dimensional structure like the one that would result from extending FIG. 7 in all three Cartesian directions, the required number of control signal lines is $$3\sqrt[3]{N}.$$

Or the other way round, if there are for example 3000 control signal lines altogether, one may utilize them to selectively drive 1 000 000 000 individual qubits in a three-dimensional array or 1 000 000 individual qubits in a two-dimensional array.

If each qubit were to need a control signal line of its own, a quantum information processing system with N qubits would need N control signal lines. The significant reduction in the number of required control signal lines that was reached above, i.e. down to $3\sqrt{N}$ or even $$3\sqrt[3]{N},$$

an advantage concerning manufacturing cost and complicatedness as well as conducted heat. However, simultaneously it may place significant challenges to control signal multiplexing: as the system should be able to control all N qubits in any case, one should basically be able to multiplex an average of $N/3\sqrt{N}$ or even $$N/3\sqrt[3]{N}$$

control signals to every control signal line. Time and/or frequency multiplexing may be used. However, as N becomes very large, such high degree of multiplexing may become inconvenient. Additionally, extensive time multiplexing may require prohibitively long coherence times of the qubits in order to yield efficient computations.

Figure 10:
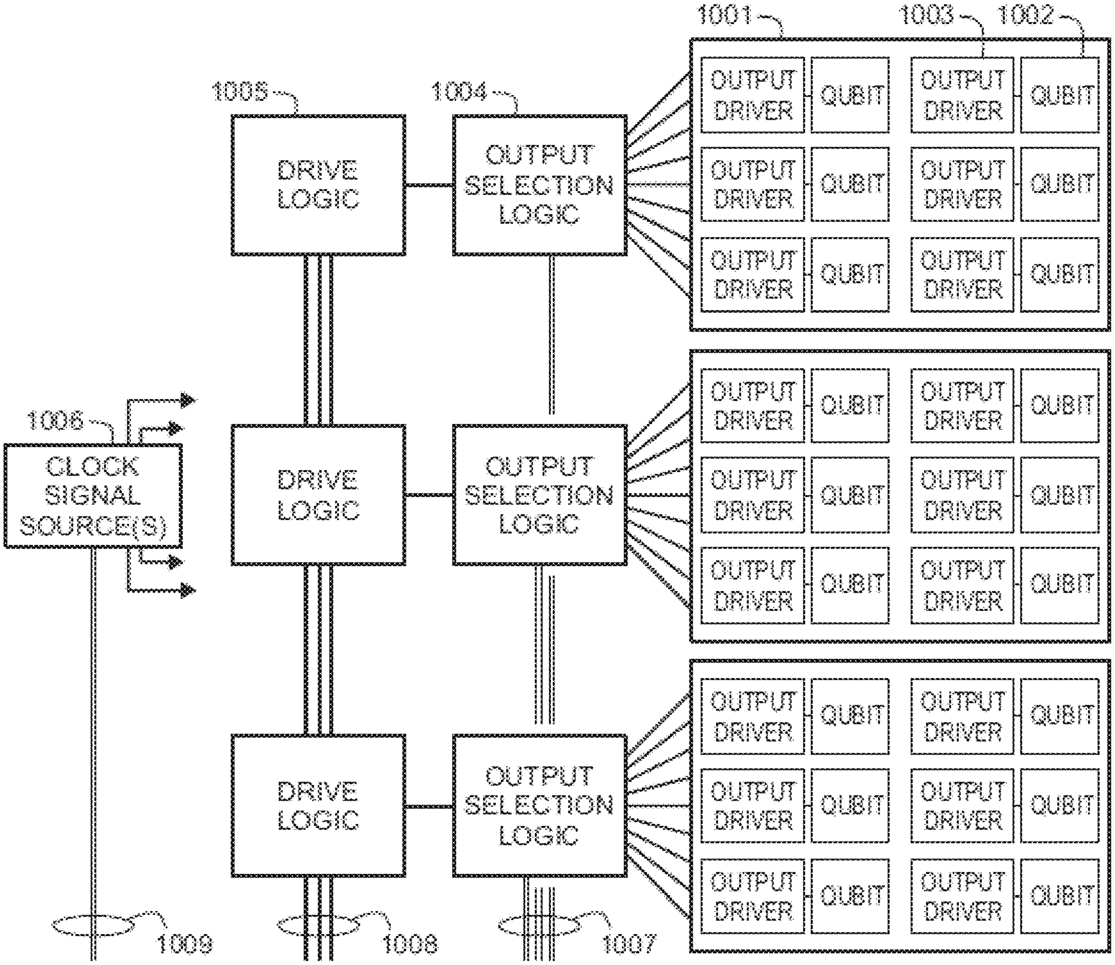
FIG. 10 illustrates a quantum information processing system with sub-arrays of qubits.

FIG. 10 shows an example of a quantum information processing system in which the aims of reducing the count of control signal lines and keeping the multiplexing and coherence time requirements reasonable are balanced. The quantum information processing system of FIG. 10 comprises fewer driver circuits than there are qubits. Consequently, at least some of the driver circuits are configured to selectively drive the qubits of a corresponding group of qubits.

In particular, in FIG. 10 the qubits are arranged in sub-arrays, of which the sub-array 1001 is an example. The functionality referred to as driver circuits of the quantum information processing system is distributed in hierarchical steps. For each qubit, like qubit 1002 for example, there is the so-called output driver 1003, which takes in AQFP-based current pulses and gives out voltage pulses to actually drive the corresponding qubit 1002. Contrary to voltage pulses, current pulses can be subjected to selection with AQFP logic with relative ease. The logic signals going to the data inputs of the output drivers 1003 are AQFP-based current pulses, as said above, so they can be subjected to selection in what are called output selection logic blocks in FIG. 10 (see output selection logic block 1004 as an example). The current pulses that are subjected to selection in the output selection logic blocks 1004 come from drive logic blocks 1005 in FIG. 10. Signals going in and out of the drive logic blocks 1005 and output selection logic blocks 1004 are AQFP-based current pulses.

The generation of clock signals for all drive logic blocks 1005, output selection logic blocks 1004, and output drivers 1003 is schematically represented with a clock signal source (s) block 1006. There could be a number of clock signal sources, so that each of them would be coupled to the differential clock inputs of some portion of the driver circuits.

Standard AQFP logic may be used to construct the output selection logic blocks 1004 in the quantum information processing system of FIG. 10. Control lines that may come from the room temperature environment are schematically shown in FIG. 10; see control lines 1007 for the output selection logic blocks 1004, control lines 1008 for the drive logic blocks 1005, and control lines 1009 for the clock signal source(s) block 1006. All in all, the use of sub-arrays of qubits, respective dedicated driver circuits, and output selection logic units helps to significantly reduce the number of control signal lines compared to the prior art approach in which each qubit required its own control signal line.

A quantum information processing system like that in FIG. 10 may be evaluated from the viewpoint of circuit complexity and requirement of substrate area. As shown above with reference to FIGS. 3 and 4, an output driver for a qubit may be possible to implement with only a handful of Josephson junctions, while—as a rough estimate—it may be assumed that a drive logic block 1006 may have in the order of 1000 junctions. It is thus much more economical to have drive logic blocks 1006 shared among a plurality of qubits than if one would need similar numbers of junctions per qubit.

Figure 11:
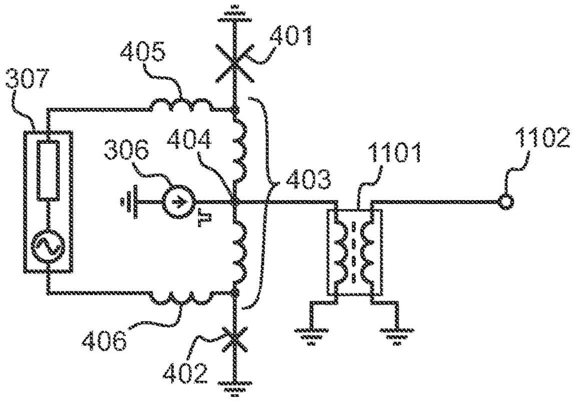
FIG. 11 illustrates a driver circuit with a coupling transformer.

FIG. 11 shows schematically a driver circuit that is otherwise similar to that of FIG. 4 but is equipped with a coupling transformer 1101 at its pulse output. As the name says, the coupling transformer 1101 comprises a primary inductance inductively coupled to a secondary inductance. The primary inductance is coupled to the pulse output of the driver circuit at point 404, and the secondary inductance is coupled to an output node 1102 of the coupling transformer. The use of a coupling transformer 1101 may add isolation to the output of the driver circuit.

Another difference to the previously discussed driver circuit is that the driver circuit of FIG. 11 receives square-formed pulses at its data input. This is illustrated by the small top-hat symbol adjacent to the control signal source 306. It has been found that the use of square-formed pulses instead of sinusoidal signals makes the two thresholds discussed earlier equal. In other words, with the use of square-formed pulses at the data input of the driver circuit, there is no "grey zone" of control current amplitude values that would cause random output, but a single threshold: if the amplitude of the control current is below the threshold, the driver circuit produces the idle pattern, and if the amplitude is above the threshold, the driver circuit produces a non-idle pattern of control pulses to the corresponding qubit.

Figure 12:
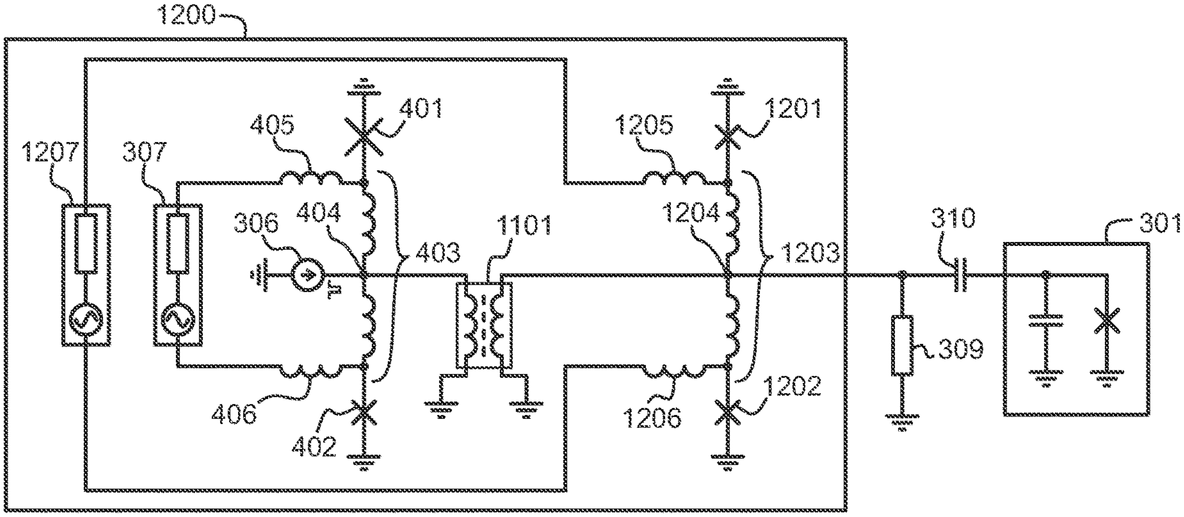
FIG. 12 illustrates a two-stage driver circuit.

FIG. 12 illustrates a two-stage driver circuit 1200. Compared to FIGS. 4 and 11, the driver circuit of FIG. 12 comprises a second stage, i.e. a further driver circuit that constitutes the middle part of FIG. 12. Parts of the second stage are the Josephson junctions 1201 and 1202, which may here be called the third and fourth junction, respectively for the purpose of unambiguous reference. As in the earlier description of FIG. 4, any or both of them could also be implemented as an array of Josephson junctions. An inductive path 1203, referred to here as the second inductive path, connects the first sides of the third and fourth junction 1201 and 1202 together. Respective ground connections connect the second sides of the third and fourth junction to a fixed reference potential, which here is shown as the ground potential.

Notably, the third and fourth junctions 1201 and 1202 do not need to have any offset between their critical current, which is schematically shown in FIG. 12 by representing both with a Josephson junction symbol of the same size. An offset between their critical current is not excluded either, but it should be noted that the offset between the critical currents of the first and second junctions 401 and 402 in the first stage of the driver circuit 1200 already establishes the threshold(s) in the response of the driver circuit 1200 to a control current flowing between the control signal source 306 and the data input 403, and the corresponding possibility of making the driver circuit generate either an idle pulse sequence or a non-idle pattern of control pulses to the corresponding qubit.

The differential clock inputs of the stages of the driver circuit 1200 are coupled to respective clock signal sources 307 and 1207. The data input of said further driver circuit is coupled to the output node of the coupling transformer 1101.

Concerning the frequencies and phases of the clock signal sources 307 and 1207, it should be noted that the first and second stages of the driver circuit 1200 play a different role. Essentially, the first stage is a piece of AQFP current-based logic whereas the second stage is generating voltage pulses for driving a qubit 301. This means that a very advantageous arrangement can be achieved by using different clocking frequencies, following the principle explained in detail in the co-pending application number PCT/FI2022/050586 of the same applicant, which co-pending application is not yet available to the public at the filing date of this application. In particular, it is advantageous to clock the first stage with a clocking frequency two times that of that used to clock the second stage. As an example, the first stage could be clocked with a 12.5 GHz clock and the second stage could be clocked with a 6.25 GHz clock.

Further, following the principle explained in detail in said co-pending application, it is advantageous to have a phase difference between the clock signals produced by the clock signal sources 307 and 1207. This phase shift is schematically illustrated with the different appearances of the small wave signs in the graphical symbols of the clock signal sources 307 and 1207. The phase difference should most advantageously be such that the voltage pulse produced in the second stage is triggered at the "flat point" of the current pulse produced in the first stage, as explained in said co-pending application.

Figure 13:
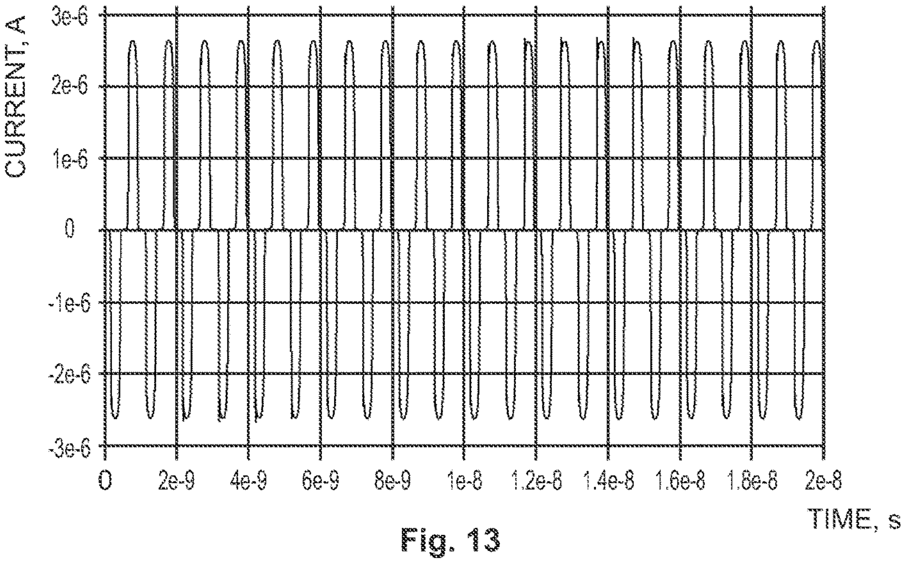
FIG. 13 illustrates an idle pulse sequence that does not cause unwanted driving.
Figure 14:
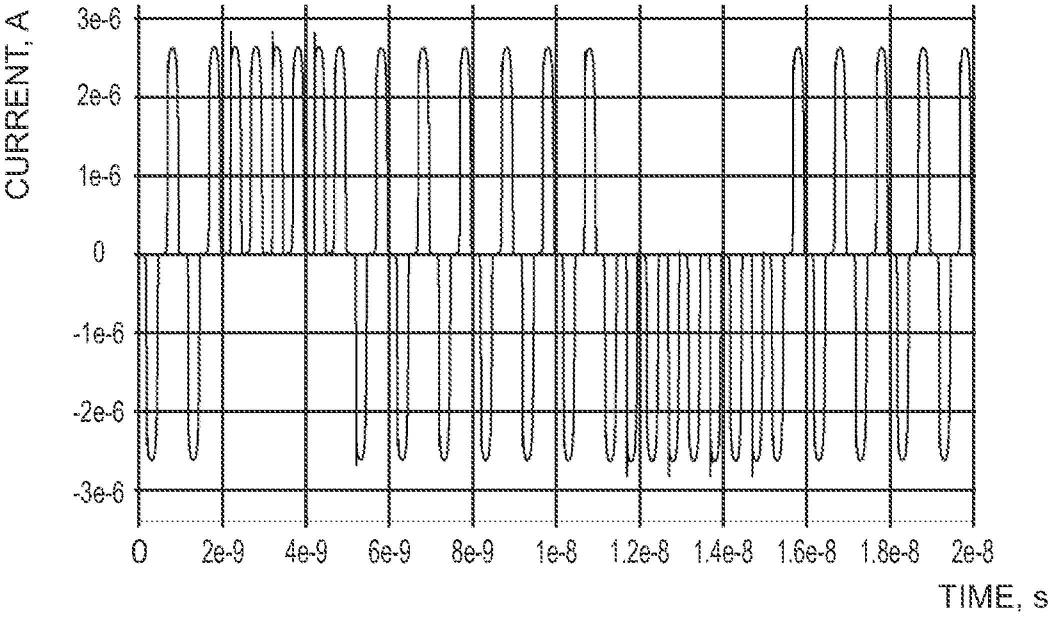
FIG. 14 illustrates a sequence of control pulses to drive a qubit.

FIGS. 13 and 14 illustrate examples of output pulse sequences of the first stage in a two-stage driver circuit like that of FIG. 12 with a control current amplitude below the threshold of 30 nA (FIG. 13) and above the threshold of 30 nA (FIG. 14). It can be seen that when the control current remains below the threshold, the output pulses form the regularly toggling idle pattern, while with control current amplitude larger than the threshold it is possible to produce a non-idle pattern of control pulses that in turn would result in a corresponding non-idle pattern of driving voltage pulses to the corresponding qubit being generated in the second stage.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A driver circuit for a qubit, the driver circuit comprising:

a first Josephson junction or first array of Josephson junctions, named the first junction below, the first junction having a first critical current, a second Josephson junction or second array of Josephson junctions, named the second junction below, the second junction having a second critical current, an inductive path connecting a first side of the first junction to a first side of the second junction, ground connections connecting respective second sides of the first junction and the second junction to a fixed reference potential, and a data input and pulse output at an intermediate point of said inductive path;

characterized in that:

the driver circuit comprises a differential clock input comprising two connections through respective inductors, one to a first half of said first junction and the other to a first half of said second junction and said first and second critical currents differ from each other by a predefined offset.

2. A driver circuit according to claim 1, wherein said predefined offset is between 50 nA and 1000 nA.

3. A driver circuit according to claim 1, wherein said first critical current and said second critical current both are larger than 1 μA and smaller than 20 μA.

4. A driver circuit according to claim 1, comprising a coupling transformer with a primary inductance inductively coupled to a secondary inductance, of which said primary inductance is coupled to said pulse output and said secondary inductance is coupled to an output node of the coupling transformer.

5. A driver circuit according to claim 4, comprising a further stage of the driver circuit, wherein said further stage of the driver circuit comprises a third Josephson junction or third array of Josephson junctions, named the third junction below, and a fourth Josephson junction or fourth array of Josephson junctions, named the fourth junction below, said further stage of the driver circuit comprises a second inductive path connecting a first side of the third junction to a first side of the fourth junction, said further stage of the driver circuit comprises ground connections connecting respective second sides of the third junction and the fourth junction to said fixed reference potential, said further stage of the driver circuit comprises a further data input and a further pulse output at an intermediate point of said second inductive path, and said further data input of said further stage of the driver circuit is coupled to said output node of the coupling transformer.

6. A driver circuit according to claim 5, wherein the further stage of the driver circuit comprises a differential clock input of its own, and wherein the differential clock inputs of said driver circuit and said further stage of the driver circuit are coupled to clock signal sources of different frequencies.

7. A driver circuit according to claim 6, wherein the differential clock input of the driver circuit is coupled to a clock signal source of a clock signal frequency two times that of a clock signal source to which the clock input of the further stage of the driver circuit is coupled.

8. A quantum information processing system comprising a first plurality of qubits to be driven, characterized in that:

the quantum information processing system comprises a second plurality of driver circuits according to claim 1, as well as couplings between the pulse outputs of at least some of said driver circuits and at least some of said qubits, the quantum information processing system is configured to feed one or more oscillating clock signals to the differential clock inputs of said driver circuits, and the quantum information processing system is configured to selectively feed data signals to the data inputs of said driver circuits.

9. A quantum information processing system according to claim 8, wherein:

said second plurality of driver circuits form a matrix of driver circuits arranged in at least first and second dimensions of said matrix, for said selective feeding of data signals, the quantum information processing system comprises an array of control signal lines, said array comprising at least a first subset and a second subset of control signal lines, the control signal lines of said first and second subsets cross said matrix in said first and second dimensions, respectively, with each driver circuit of said second plurality of driver circuits being a unique driver circuit coupled to a respective unique pair of a control signal line of the first subset and a control signal line of the second subset, and the quantum information processing system is configured to selectively feed synchronized control signals through unique pairs of a control signal line of the first subset and a control signal line of the second subset for making the unique driver circuit coupled to these drive a corresponding qubit.

10. A quantum information processing system according to claim 9, wherein:

said array of control signal lines comprises, in addition to said first and second subsets, a third subset of control signal lines crossing said matrix in a third dimension, with each driver circuit of said second plurality of driver circuits being the unique driver circuit coupled to a respective unique triplet of a control signal line of the first subset, a control signal line of the second subset, and a control signal line of the third subset, and the quantum information processing system is configured to selectively feed synchronized control signals through unique triplets of a control signal line of the first subset, a control signal line of the second subset, and a control signal line of the third subset, for making the unique driver circuit coupled to these drive a corresponding qubit.

11. A quantum information processing system according to claim 8, wherein the quantum information processing system is configured to use sinusoidal signals as control signals.

12. A quantum information processing system according to claim 8, wherein the quantum information processing system is configured to use square pulses as control signals.

13. A quantum information processing system according to claim 8, comprising:

as many output driver circuits as there are said qubits, with each of said output driver circuits configured to drive a respective one of said qubits, a set of drive logic circuits, fewer in number than said output driver circuits, and a set of output selection logic circuits, fewer in number than said output driver circuits, coupled between said drive logic circuits and said output driver circuits and configured to selectively couple outputs of said drive logic circuits to selected ones of said output driver circuits.

14. A quantum computer comprising a quantum information system according to claim 8.

15. A method for producing driving signals for a qubit using a driver circuit that comprises:

a first Josephson junction or first array of Josephson junctions, named the first junction below, the first junction having a first critical current, a second Josephson junction or second array of Josephson junctions, named the second junction below, the second junction having a second critical current, an inductive path connecting a first side of the first junction to a first side of the second junction, and ground connections connecting respective second sides of the first junction and the second junction to a fixed reference potential;

wherein said first and second critical currents differ from each other by a predefined offset, and wherein the method comprises:

providing two components of a first differential clock signal to the driver circuit simultaneously through respective two inductors, one coupled to a first half of said first junction and the other coupled to a first half of said second junction, providing pulsating data signals to a data input at an intermediate point of said inductive path, and conducting pulsating output signals towards said qubit through a pulse output at said intermediate point.

16. A method according to claim 15, comprising:

conducting said pulsating output signals into a primary inductance of a coupling transformer, and conducting respective pulsating further output signals from a secondary inductance of said coupling transformer, inductively coupled to said primary inductance, towards said qubit.

17. A method according to claim 16, comprising:

conducting said pulsating further output signal into a data input of a further stage of the driver circuit, which further stage comprises a third Josephson junction or third array of Josephson junctions, named the third junction below, and a fourth Josephson junction or fourth array of Josephson junctions, named the fourth junction below; a second inductive path connecting a first side of the third junction to a first side of the fourth junction; and ground connections connecting respective second sides of the third junction and the fourth junction to said fixed reference potential, wherein said data input of said further stage of the driver circuit is at an intermediate point of said second inductive path, providing the two components of a second differential clock signal, having a different frequency than said first differential clock signal, to said further stage of the driver circuit simultaneously through respective two inductors, one coupled to said first half of said third junction and the other coupled to said first half of said fourth junction, and conducting pulsating output signals of said further stage of the driver circuit towards said qubit through a pulse output at said intermediate point of said second inductive path.

18. A method according to claim 17, wherein the clock signal frequency of said first differential clock signal is two times that of the second differential clock signal.

* * * * *